United States Patent
Zhu et al.

(10) Patent No.: US 11,335,760 B2
(45) Date of Patent: May 17, 2022

(54) DISPLAY PANEL HAVING PORTION OF ENCAPSULATION LAYER LOCATED IN HOLLOW REGION THAT IS DIRECT CONTACT WITH FIRST INORGANIC LAYER, MANUFACTURING METHOD THEREOF, AND DISPLAY DEVICE HAVING THE SAME

(71) Applicant: Yungu (Gu'an) Technology Co., Ltd., Hebei (CN)

(72) Inventors: Ping Zhu, Kunshan (CN); Xueyuan Li, Kunshan (CN); Shengfang Liu, Kunshan (CN); Ying Huang, Kunshan (CN); Qingqing Dong, Kunshan (CN); Lei Lv, Kunshan (CN)

(73) Assignee: Yungu (Gu'an) Technology Co., Ltd., Langfang (CN)

( * ) Notice: Subject to any disclaimer, the term of this patent is extended or adjusted under 35 U.S.C. 154(b) by 149 days.

(21) Appl. No.: 16/902,652

(22) Filed: Jun. 16, 2020

(65) Prior Publication Data

US 2020/0312945 A1    Oct. 1, 2020

Related U.S. Application Data

(63) Continuation of application No. PCT/CN2019/088614, filed on May 27, 2019.

(30) Foreign Application Priority Data

Sep. 30, 2018  (CN) .......................... 201811159712.2

(51) Int. Cl.
*H01L 29/08* (2006.01)
*H01L 27/32* (2006.01)
*H01L 51/52* (2006.01)

(52) U.S. Cl.
CPC ...... *H01L 27/3276* (2013.01); *H01L 27/3262* (2013.01); *H01L 27/3265* (2013.01); *H01L 51/5253* (2013.01); *H01L 2227/323* (2013.01)

(58) Field of Classification Search
CPC ............ H01L 27/3276; H01L 27/3262; H01L 27/3265; H01L 51/5253; H01L 2227/323
(Continued)

(56) References Cited

U.S. PATENT DOCUMENTS

2015/0325634 A1   11/2015  Chao et al.
2015/0364527 A1*  12/2015  Wang .................. H01L 27/3244
                                                257/40
(Continued)

FOREIGN PATENT DOCUMENTS

CN   104241550 A   12/2014
CN   104393022 A   3/2015
(Continued)

OTHER PUBLICATIONS

Chinese Office Action dated Apr. 2, 2020 in corresponding Chinese Application No. 201811159712.2; 13 pages.
(Continued)

*Primary Examiner* — Phuc T Dang
(74) *Attorney, Agent, or Firm* — Maier & Maier, PLLC

(57) ABSTRACT

Display panel, manufacturing method thereof, and display device are provided. As an example, the display panel includes a substrate, a TFT layer formed on the substrate, and an encapsulation layer formed on the TFT layer. The TFT layer includes a thin film transistor with a source electrode, a drain electrode and a gate electrode, and further includes a first metal layer, a first inorganic layer on the first metal layer, and a second metal layer on the first inorganic layer. The second metal layer includes a first region and a second region, a hollowed-out region is formed between the
(Continued)

first region and the second region, and the first region and the second region are electrically connected via the first metal layer. A portion of the encapsulation layer that is located in the hollowed-out region is in contact with the first inorganic layer.

16 Claims, 7 Drawing Sheets

(58) Field of Classification Search
USPC .......................................................... 257/40
See application file for complete search history.

(56) References Cited

U.S. PATENT DOCUMENTS

| | | | |
|---|---|---|---|
| 2016/0013436 A1* | 1/2016 | Im | H01L 51/0017 |
| | | | 257/40 |
| 2016/0126300 A1 | 5/2016 | Su et al. | |
| 2016/0190454 A1* | 6/2016 | You | H01L 27/3265 |
| | | | 257/40 |
| 2016/0307923 A1 | 10/2016 | Chao et al. | |
| 2018/0061920 A1* | 3/2018 | Son | H01L 27/3265 |

FOREIGN PATENT DOCUMENTS

| | | |
|---|---|---|
| CN | 105097825 A | 11/2015 |
| CN | 107665906 A | 2/2018 |
| CN | 107845656 A | 3/2018 |
| CN | 107919380 A | 4/2018 |
| CN | 107968114 A | 4/2018 |
| CN | 108074957 A | 5/2018 |
| CN | 108336109 A | 7/2018 |
| CN | 108573920 A | 9/2018 |
| CN | 109326634 A | 2/2019 |
| CN | 208848933 U | 5/2019 |

OTHER PUBLICATIONS

International Search Report dated Aug. 28, 2019 in corresponding International Application No. PCT/CN2019/088614; 4 pages.
Written Opinion dated Aug. 28, 2019 in corresponding International Application No. PCT/CN2019/088614; 8 pages.

* cited by examiner

DISPLAY PANEL HAVING PORTION OF ENCAPSULATION LAYER LOCATED IN HOLLOW REGION THAT IS DIRECT CONTACT WITH FIRST INORGANIC LAYER, MANUFACTURING METHOD THEREOF, AND DISPLAY DEVICE HAVING THE SAME

CROSS REFERENCE TO RELATED APPLICATIONS

This disclosure is a continuation application of International Patent Application No. PCT/CN2019/088614, filed on May 27, 2019, which claims priority to Chinese Patent Application No. 2018111597122, titled "DISPLAY PANEL, MANUFACTURING METHOD THEREOF, AND DISPLAY DEVICE", filed on Sep. 30, 2018, the entire content of which is incorporated herein by reference.

TECHNICAL FIELD

The present disclosure relates to the field of display technologies, and particularly to a display panel, a manufacturing method thereof, and a display device.

BACKGROUND

Compared with other display devices, Organic Light-Emitting Diode (referred briefly to as OLED) display devices have the advantages of low power consumption and good display brightness due to their self-luminous characteristics.

At an edge portion of the OLED display device, the encapsulation layer is in contact with the metal layer in the Thin Film Transistor (referred briefly to as TFT) layer, and thus the display device is prone to encapsulation failure at the edge portion.

SUMMARY

According to a first aspect of the present disclosure, a display panel is provided. The display panel includes: a substrate, a TFT layer on the substrate, and an encapsulation layer on the TFT layer. The TFT layer includes a thin film transistor with a source electrode, a drain electrode and a gate electrode, and further includes a first metal layer, a first inorganic layer on the first metal layer, and a second metal layer on the first inorganic layer. The second metal layer includes a first region and a second region. A hollowed-out region is formed between the first region and the second region. The first region and the second region are electrically connected via the first metal layer. A portion of the encapsulation layer that is located in the hollowed-out region is in direct contact with the first inorganic layer.

Optionally, the first inorganic layer includes a first contact hole and a second contact hole which are spaced apart, the first contact hole and the second contact hole are filled with metal, the first region and the first metal layer are electrically connected via the metal in the first contact hole, and the second region and the first metal layer are electrically connected via the metal in the second contact hole.

Optionally, the first contact hole has a width smaller than that of the first metal layer, and the second contact hole has a width smaller than that of the first metal layer.

Optionally, the TFT layer further includes an annular dam formed on the second metal layer, the second region is located outside the dam, and the first metal layer is at least partially located below the dam.

Optionally, the display panel further includes an OLED layer formed between the TFT layer and the encapsulation layer, and the OLED layer is located in a region enclosed by the dam.

Optionally, the first metal layer has a width ranging from 200 µm to 2000 µm.

Optionally, the TFT layer further includes a capacitor upper plate, the first metal layer is on the same layer as the capacitor upper plate, and the second metal layer is on the same layer as the source electrode.

Optionally, the TFT layer further includes the first metal layer is on the same layer as the gate electrode, and the second metal layer is on the same layer as the source electrode.

Optionally, a marginal region of the TFT layer is provided with a plurality of first contact holes and a plurality of second contact holes, and the plurality of first contact holes are in one-to-one correspondence with the plurality of second contact holes.

Optionally, the display panel further includes a buffer layer formed between the substrate and the TFT layer, the material of the buffer layer is at least one of silicon oxide or silicon nitride.

Optionally, the display panel is a flexible display panel.

According to a second aspect of the present disclosure, a manufacturing method of a display panel is provided. The manufacturing method includes: providing a substrate; forming a TFT layer on the substrate, where the TFT layer includes a thin film transistor with a source electrode, a drain electrode and a gate electrode, and further includes a first metal layer, a first inorganic layer on the first metal layer, and a second metal layer on the first inorganic layer, the second metal layer includes a first region and a second region, a hollowed-out region is formed between the first region and the second region, and the first region and the second region are electrically connected via the first metal layer; and forming a encapsulation layer on the TFT layer, where a portion of the encapsulation layer that is located in the hollowed-out region is in direct contact with the first inorganic layer.

Optionally, forming a TFT layer on the substrate, wherein the TFT layer includes a thin film transistor with a source electrode, a drain electrode and a gate electrode, and further includes a first metal layer, a first inorganic layer on the first metal layer, and a second metal layer on the first inorganic layer, the second metal layer comprises a first region and a second region, a hollowed-out region is formed between the first region and the second region, and the first region and the second region are electrically connected via the first metal layer, specifically includes:

forming a semiconductor layer, forming a gate insulating layer on the semiconductor layer, and forming the gate electrode and a capacitor lower plate on the gate insulating layer on the substrate; forming a capacitor insulating layer on the gate electrode and the capacitor lower plate, and forming a capacitor upper plate and a first metal layer on the capacitor insulating layer; forming an interlayer dielectric layer on the capacitor upper plate and the first metal layer, forming a first contact hole and a second contact hole located above the first metal layer in the interlayer dielectric layer, and forming a third contact hole and a fourth contact hole penetrating through the interlayer dielectric layer, the capacitor insulating layer and the gate insulating layer above the semiconductor layer; forming the source electrode, the drain electrode, the first region and the second region on the interlayer dielectric layer, and filling the first contact hole, the second contact hole, the third contact hole, and the fourth contact hole with metal.

Optionally, forming a TFT layer on the substrate, wherein the TFT layer includes a thin film transistor with a source electrode, a drain electrode and a gate electrode, and further includes a first metal layer, a first inorganic layer on the first metal layer, and a second metal layer on the first inorganic layer, the second metal layer comprises a first region and a second region, a hollowed-out region is formed between the first region and the second region, and the first region and the second region are electrically connected via the first metal layer, specifically includes:

forming a semiconductor layer on the substrate, forming a gate insulating layer on the semiconductor layer, and forming the gate electrode, a capacitor lower plate and the first metal layer on the gate insulating layer; forming a capacitor insulating layer on the gate electrode, the capacitor lower plate and the first metal layer, and forming a capacitor upper plate on the capacitor insulating layer; forming an interlayer dielectric layer on the capacitor upper plate, forming a first contact hole and a second contact hole penetrating through the interlayer dielectric layer and the capacitor insulating layer above the first metal layer, and forming a third contact hole and a fourth contact hole penetrating through the interlayer dielectric layer, the capacitor insulating layer and the gate insulating layer above the semiconductor layer; forming the source electrode, the drain electrode, the first region and the second region on the interlayer dielectric layer, and filling the first contact hole, the second contact hole, the third contact hole, and the fourth contact hole with metal.

Optionally, the manufacturing method further includes forming a planarization layer on the source electrode and the drain electrode, and forming a dam on the planarization layer.

According to a third aspect of the present disclosure, a display device is provided. The display panel includes the display panel described above.

In the display panel, manufacturing method thereof, and display device provided by the present disclosure, the first region of the second metal layer of the TFT layer is electrically connected to the second region of the second metal layer of the TFT layer through the second metal layer, so as to ensure the normal operation of the display panel. A portion of the encapsulation layer which is located in the hollowed-out region is in contact with the first inorganic layer, so that an adhesion between the TFT layer and the encapsulation layer is increased, thereby effectively preventing the TFT layer and the encapsulation layer from being peeled off each other, which improves the effect of encapsulation and lengthens the service life of the display panel.

The general descriptions above and the detailed description below are merely exemplary and explanatory, and are not intended to limit the present disclosure.

DETAILED DESCRIPTION

Figure 1:
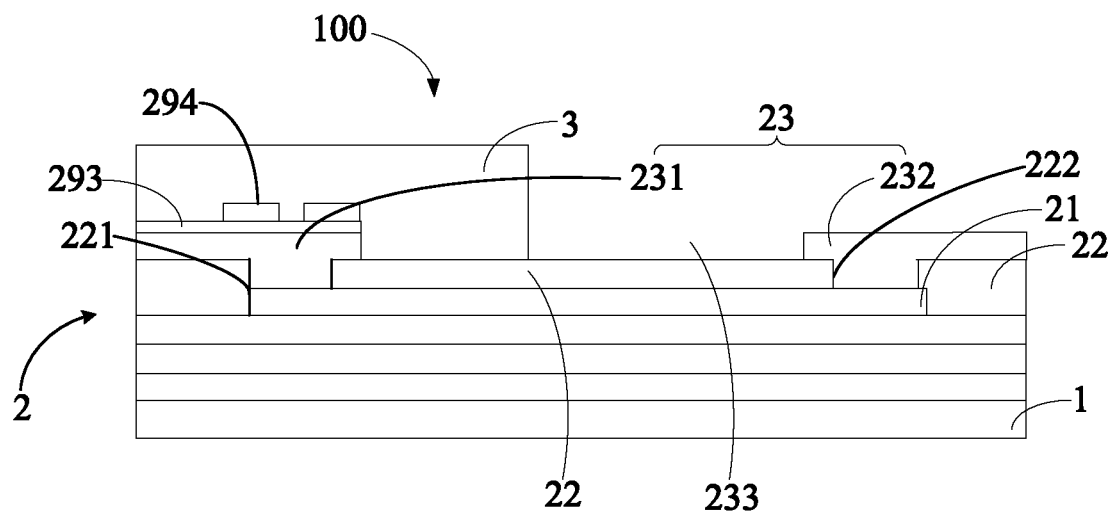
FIG. 1 is a structural diagram of a display panel according to an example of the present disclosure.

Exemplary embodiments will be described in detail herein, examples of which are shown in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses consistent with aspects related to the disclosure as recited in the appended claims.

The terminology used in the present disclosure is for the purpose of describing particular embodiments only, and is not intended to limit the present disclosure. Unless otherwise defined, technical or scientific terms used herein have the same meaning as commonly understood by those of ordinary skill in the art to which the invention pertains. The singular forms "one" and "a" used in the specification and the claims are not intended to indicate a limitation on quantity but indicate at least one. The singular forms "include" or "contain" is intended to mean that an element or object before "include" or "contain" covers an element, object or its equivalents listed after "include" or "contain", and does not exclude other elements or objects. "Connect" or "connect with" or the like is not limited to physical or mechanical connection, but includes direct or indirect electrical connection. "a plurality" indicates two or more unless specifically defined otherwise. As used in the present disclosure and the appended claims, the singular forms "a," "an," and "the" are intended to include the plural forms as well, unless the context clearly indicates otherwise. It shall also be understood that the term "and/or" used herein is intended to signify and include any or all possible combinations of one or more of the associated listed items.

The display panel and the manufacturing method of the same in the embodiments of the present disclosure are described in detail below with reference to the accompanying drawings. The features of the embodiments and implementations described below may be complementary to or combined with each other in cases of no conflict.

In the embodiments of the present disclosure, for convenience of description, the direction from the substrate toward the TFT layer is defined as UP, and the direction from the TFT layer toward the substrate is defined as DOWN, so that an up-and-down direction is determined. It is easy to understand that different manners of defining the direction do not affect the actual operation of the process and the actual shape of the product.

In general, at the edge portion of the OLED display device, the encapsulation layer is in contact with the metal layer in the TFT layer. Due to the poor adhesion between the encapsulation layer and the metal layer, the encapsulation layer is prone to peel off the underlying metal layer, so that the display device is prone to encapsulation failure at the edge portion, which affects the display effect and the service life of the display device.

In order to effectively solve the above problem, the present disclosure provides a display panel.

FIG. 1 is a structural diagram of a display panel 100 according to the present disclosure. With reference to FIG. 1, a flexible display panel 100 according to an example of the present disclosure includes a substrate 1, a TFT layer 2, and an encapsulation layer 3. The TFT layer 2 is located on the substrate 1, and the encapsulation layer 3 is located on the TFT layer 2. The TFT layer 2 includes a thin film transistor with a source electrode, a drain electrode and a gate electrode, and further includes a first metal layer 21, a first inorganic layer 22 on the first metal layer 21, and a second metal layer 23 on the first inorganic layer 22. The second metal layer 23 includes a first region 231 and a second region 232. A hollowed-out region 233 is formed between the first region 231 and the second region 232, and the first region 231 and the second region 232 are electrically connected via the first metal layer 21. A portion of the encapsulation layer 3 that is located in the hollowed-out region 233 is in contact with the first inorganic layer 22.

In the display panel 100 according to the examples of the present disclosure, the first region 231 of the second metal layer 23 is electrically connected with the second region 232 via the first metal layer 21, so as to ensure the normal operation of the display panel 100. The portion of the encapsulation layer 3 which is located in the hollowed-out region 233 is in contact with the first inorganic layer 22, so that an adhesion between the TFT layer 2 and the encapsulation layer 3 is increased, thereby effectively preventing the TFT layer 2 and the encapsulation layer 3 from being peeled off from each other, which lengthens the service life of the display panel 100.

The material of the first inorganic layer 22 may be silicon oxide or silicon nitride. The substrate 1 may be a flexible substrate or a rigid substrate. The flexible substrate may be made of at least one of the following materials: polyethylene naphthalate, polyethylene terephthalate, polyimide, polyethersulfone resin, polycarbonate, or polyetherimide. The material of the rigid substrate may be glass.

Optionally, the first inorganic layer 22 is provided with a first contact hole 221 and a second contact hole 222 which are spaced apart. The first contact hole 221 and the second contact hole 222 are filled with metal. The first region 231 and the first metal layer 21 are electrically connected via the metal in the first contact hole 221, and the second region 232 and the first metal layer 21 are electrically connected via the metal in the second contact hole 222. The first region 231 and the second region 232 are electrically connected with the first metal layer 21 via the metal in the first contact hole 221 and the second contact hole 222. In this way, the structure is simple, and the process is easy to implement.

Figure 2:
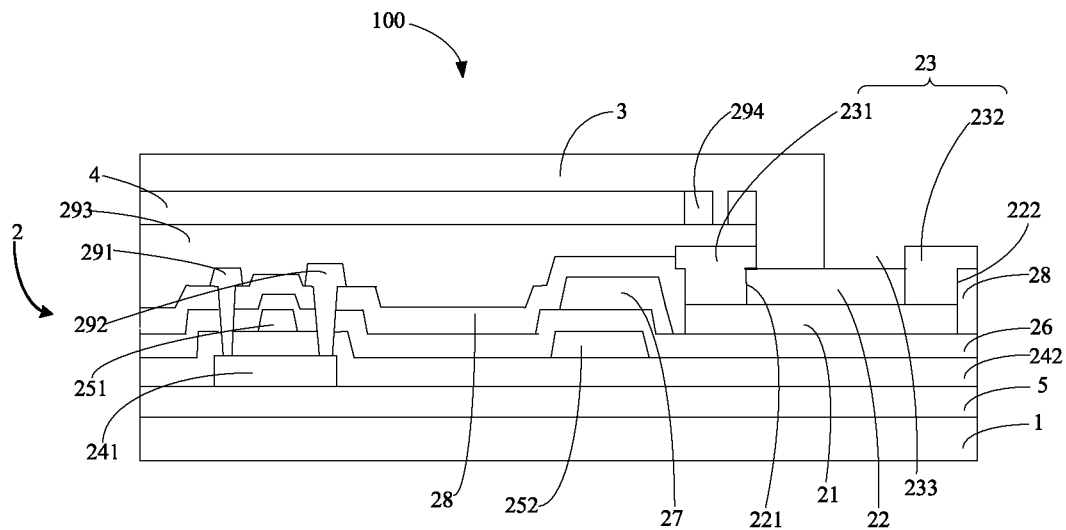
FIG. 2 is another structural diagram of the display panel according to an example the present disclosure.
Figure 3:
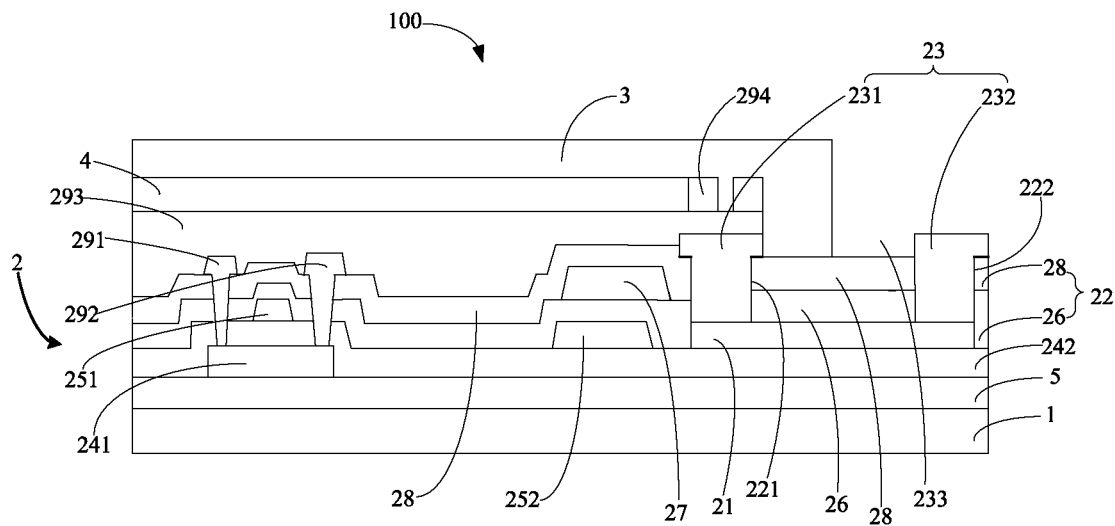
FIG. 3 is still another structural diagram of the display panel according to the present disclosure.
Figure 10:
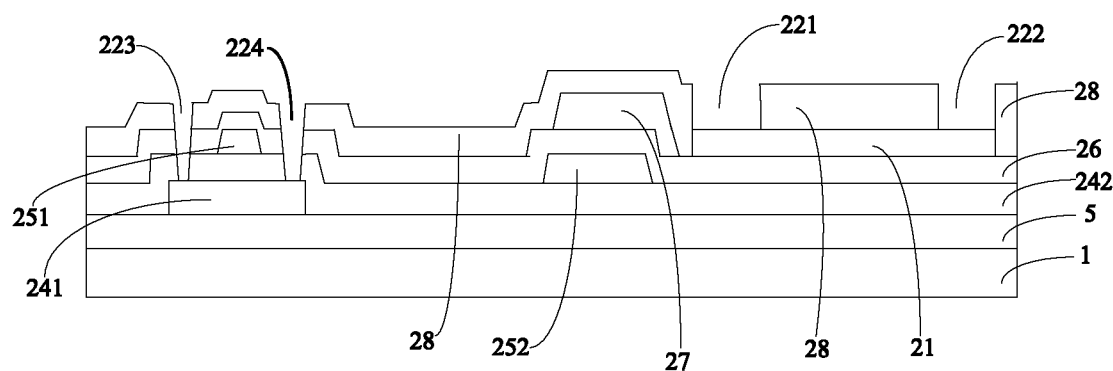
FIG. 10 is a structural diagram of a third intermediate structure according to an example of the present disclosure.

Optionally, as shown in FIG. 2 and FIG. 3, the TFT layer 2 further includes: a semiconductor layer 241 formed above the substrate 1; a gate insulating layer 242 formed on the semiconductor layer 241; a gate electrode 251 and a capacitor lower plate 252 formed on the gate insulating layer 242; a capacitor insulating layer 26 formed on the gate electrode 251 and the capacitor lower plate 252; a capacitor upper plate 27 formed on the capacitor insulating layer 26; an interlayer dielectric layer 28 formed on the capacitor upper plate 27; two contact holes (the two contact holes are a third contact hole 223 and a fourth contact hole 224 as described below and shown in FIG. 10) formed in the interlayer dielectric layer 28, the capacitor insulating layer 26, and the gate insulating layer 242; a source electrode 291 and a drain electrode 292 formed in the contact holes and on the interlayer dielectric layer 28; a planarization layer 293 formed on the source electrode 291 and the drain electrode 292; and an annular dam 294 formed on the planarization layer 293. A capacitor is formed by the capacitor lower plate 252 and the capacitor upper plate 27. One of the capacitor lower plate 252 and the capacitor upper plate 27 is an anode of the capacitor, and the other is a cathode of the capacitor. The TFT layer 2 has a central region and a marginal region surrounding the central region. The planarization layer 293 is formed in the central region.

The display panel 100 further includes an OLED layer 4 formed between the TFT layer 2 and the encapsulation layer 3. The OLED layer 4 is enclosed by the dam 294. The encapsulation layer 3 covers the OLED layer 4 and the marginal region of the TFT layer 2. The OLED layer 4 may include an anode, an organic light emitting layer on the anode, and a cathode on the organic light emitting layer. The anode of the OLED layer 4 is in contact with the drain electrode of the TFT layer 2.

Optionally, the second region 232 and the hollowed-out region 233 are located in the marginal region outside the dam 294. The first region 231 may be located below the dam 294, and the first metal layer 21 is at least partially below the dam 294. In a case where the display panel 100 has a constant area, when at least a part of the first region 231 is disposed below the dam 294, compared to disposing the first region 231 outside the dam 294, the dam 294 may be disposed closer to an edge of the display panel 100 because the second region 232 and the hollowed-out region 233 are located outside the dam 294 and the OLED layer 4 is enclosed by the dam 294, thereby increasing the area of a region enclosed by the dam 294, which increases an area of the OLED layer 4, i.e., an area of a display region.

Optionally, with reference to FIG. 2 again, the first metal layer 21 is on the same layer as the capacitor upper plate 27, and the second metal layer 23 is on the same layer as the source electrode 291 and the drain electrode 292. The first inorganic layer 22 is a portion of the interlayer dielectric layer 28 which is located in the marginal region.

In another example, with reference to FIG. 3 again, the first metal layer 21 is on the same layer as the gate electrode 251, and the second metal layer 23 is on the same layer as the source electrode 291 and the drain electrode 292. The first inorganic layer 22 is a portion, which is located in the marginal region, of both the capacitor insulating layer 26 and the interlayer dielectric layer 28. The first contact hole

221 and the second contact hole 222 penetrate the capacitor insulating layer 26 and the interlayer dielectric layer 28, respectively. The encapsulation layer 3 is in contact with the interlayer dielectric layer 28.

The second metal layer 23 may be configured as data lines. The first region 231 of the second metal layer 23 may be coupled to a plurality of source electrodes 291 in the same row, and the second region 232 of the second metal layer 23 may be coupled to a flexible printed circuit board.

Figure 4:
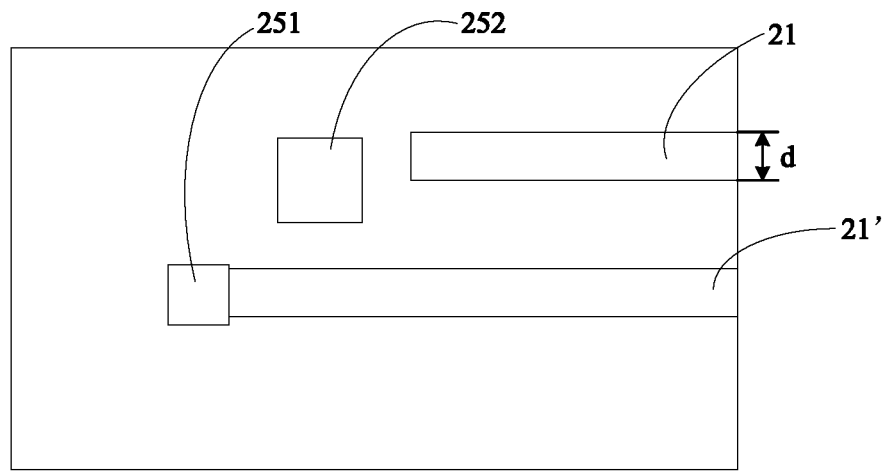
FIG. 4 is a top view of the display panel shown in FIG. 1.

Furthermore, with reference to FIG. 4, when the gate electrode 251 and the capacitor lower plate 252 are formed, the first metal layer 21 and the first metal layer 21' are formed in the marginal region. The first metal layer 21 is not coupled to the gate electrode 251 and configured to couple with the metal in the two contact holes (the first contact hole 221 and the second contact hole 222 shown in FIG. 3). The first metal layer 21' is coupled to the gate electrode 251 and configured as scan lines to receive an electrical signal to cause the TFT layer 2 to drive the organic light-emitting layer of the OLED layer 4 to emit light.

Figure 5:
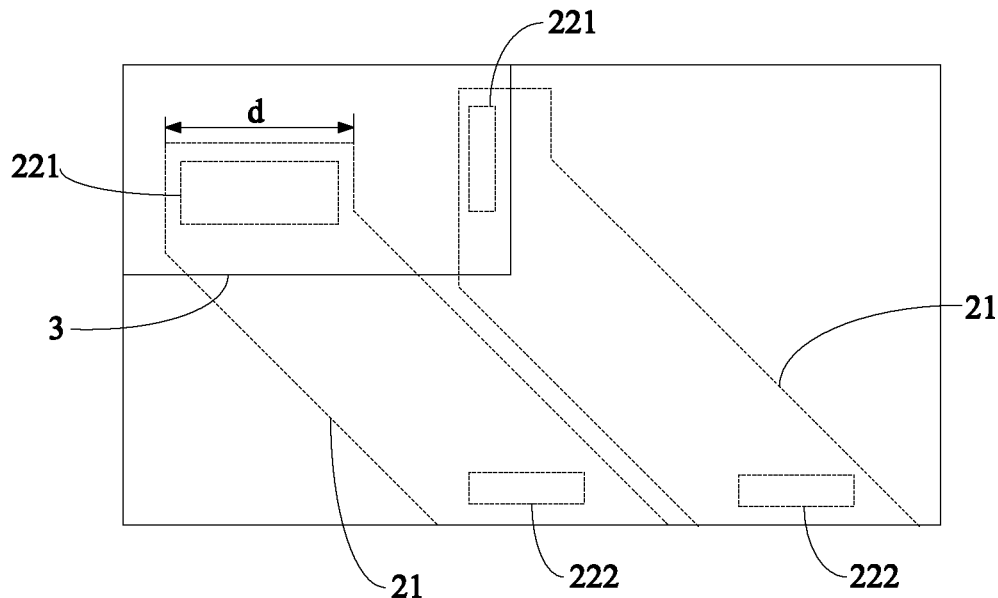
FIG. 5 is a top view of the display panel shown in FIG. 1.

Optionally, the marginal region of the TFT layer 2 may be provided with a plurality of first contact holes 221, and a plurality of second contact holes 222 that are in one-to-one correspondence with the plurality of first contact holes 221. As shown in FIG. 5, the first contact holes 221 and the second contact holes 222 are in contact with the first metal layer 21, respectively. The first metal layer 21 may have a width d ranging from 200 μm to 2000 μm, such as 250 μm, 500 μm, 1000 μm, 1500 μm, 1800 μm, and the like. As such, it ensures that the first metal layer 21 has a smaller resistance, while the first metal layer 21 is ensured to be effectively connected with the first region 231 and the second region 232 of the second metal layer 23. A width direction of the first metal layer 21 refers to a direction perpendicular to an extending direction of the first metal layer 21, and a width of the first metal layer 21 is a dimension of the first metal layer 21 in the width direction.

Furthermore, the first contact hole 221 and the second contact hole 222 may have widths or diameters slightly smaller than that of the first metal layer 21, so that it may avoid that the metal in the first contact hole 221 and the second contact hole 222 is in contact with other metal adjacent to the first metal layer 21 to affect the normal operation of the display panel 100. A width direction of the first contact hole 221 and the second contact hole 222 is the same as the width direction of the first metal layer 21.

Optionally, the encapsulation layer 3 may be a Thin Film Encapsulation (referred briefly to as TFE) layer, and the encapsulation layer 3 includes a second inorganic layer (not shown) formed on the TFT layer 2. The second inorganic layer is the lowermost layer of the encapsulation layer 3, and is in contact with the first inorganic layer. The first inorganic layer 22 is made of the same material as the second inorganic layer. A portion of the second inorganic layer that is located in the hollowed-out region 233 is in contact with the first inorganic layer 22. The adhesion between the second inorganic layer and the first inorganic layer 22 is better due to their same material, which further improves the adhesion between the encapsulation layer 3 and the marginal region of the TFT layer 2. In this way, the effect of encapsulation is improved, thereby lengthening the service life of the display panel 100. The first inorganic layer 22 and the second inorganic layer may be made of silicon oxide or silicon nitride.

The encapsulation layer 3 may also include a laminated layer with organic layer(s) and inorganic layer(s) which is formed on the second inorganic layer. For example, the encapsulation layer 3 is a three-layer structure with a silicon nitride layer, an organic layer, and a silicon nitride layer. This laminated or three-layer structure can increase the adhesion between the encapsulation layer and the TFT layer.

Optionally, the display panel 100 further includes a buffer layer 5 formed between the substrate 1 and the TFT layer 2. The buffer layer 5 may be made of silicon oxide to improve the adhesion between the substrate 1 and the TFT layer 2. The buffer layer 5 may also be made of silicon nitride, or the buffer layer 5 may also include a silicon oxide layer and a silicon nitride layer.

In addition to being used as a display device, the display panel 100 provided by the examples of the present disclosure may also be used as a touch panel by disposing a touch layer on the encapsulation layer. The display panel 100 may even serve as a semi-finished product and be integrated and assembled with other components to form a display device, such as a mobile phone, a tablet computer (referred briefly to as PAD), an on-board display screen, and the like.

Figure 6:
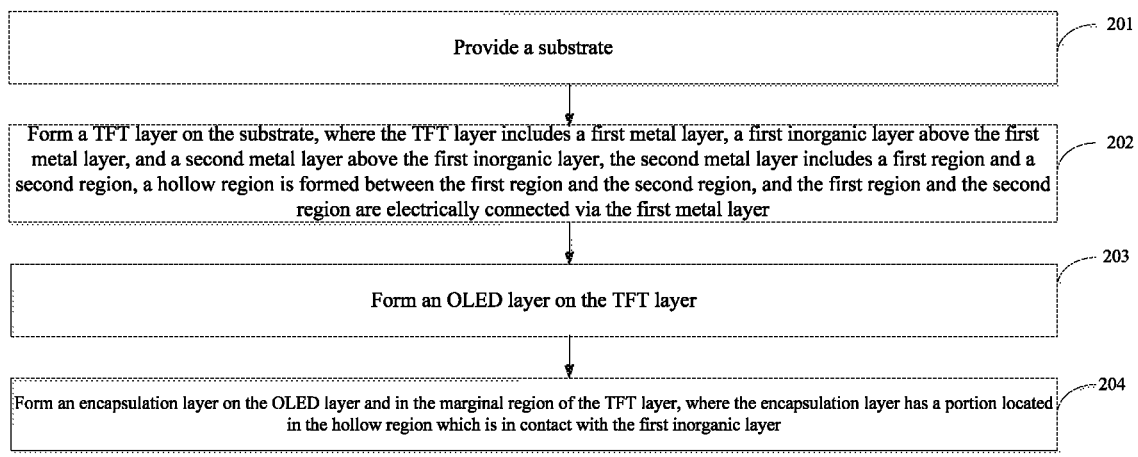
FIG. 6 is a flowchart of a manufacturing method of a display panel according to an example of the present disclosure.

FIG. 6 is a flowchart of a manufacturing method of a display panel according to an example of the present disclosure. With reference to FIG. 6, the manufacturing method includes steps 201 to 204.

At step 201, a substrate is provided.

Optionally, the substrate may be a flexible substrate, and thus the display panel is a flexible display panel. The flexible substrate may be made of at least one of the following materials: polyethylene naphthalate, polyethylene terephthalate, polyimide, polyethersulfone resin, polycarbonate, or polyetherimide. In other examples, the substrate may be a rigid substrate, and the rigid substrate may be made of glass.

After step 201, the manufacturing method further includes forming a buffer layer 5 on the substrate 1.

At step 202, a TFT layer is formed on the substrate, where the TFT layer includes a thin film transistor with a source electrode 291, a drain electrode 292 and a gate electrode 251, and further includes a first metal layer 21, a first inorganic layer 22 on the first metal layer 21, and a second metal layer 23 on the first inorganic layer 22. The second metal layer 23 includes a first region 231 and a second region 232, a hollowed-out region 233 is formed between the first region 231 and the second region 232, and the first region 231 and the second region 232 are electrically connected via the first metal layer.

The TFT layer 2 further includes a semiconductor layer 241, a gate insulating layer 242, a capacitor lower plate 252, a capacitor insulating layer 26, a capacitor upper plate 27, an interlayer dielectric layer 28, a planarization layer 293, and a dam 294.

Optionally, the first inorganic layer 22 includes a first contact hole 221 and a second contact hole 222 which are spaced apart. The first contact hole 221 and the second contact hole 222 are filled with metal. The first region 231 and the first metal layer 21 are electrically connected via the metal in the first contact hole 221, and the second region 232 and the first metal layer 21 are electrically connected via the metal in the second contact hole 222.

Figure 7:
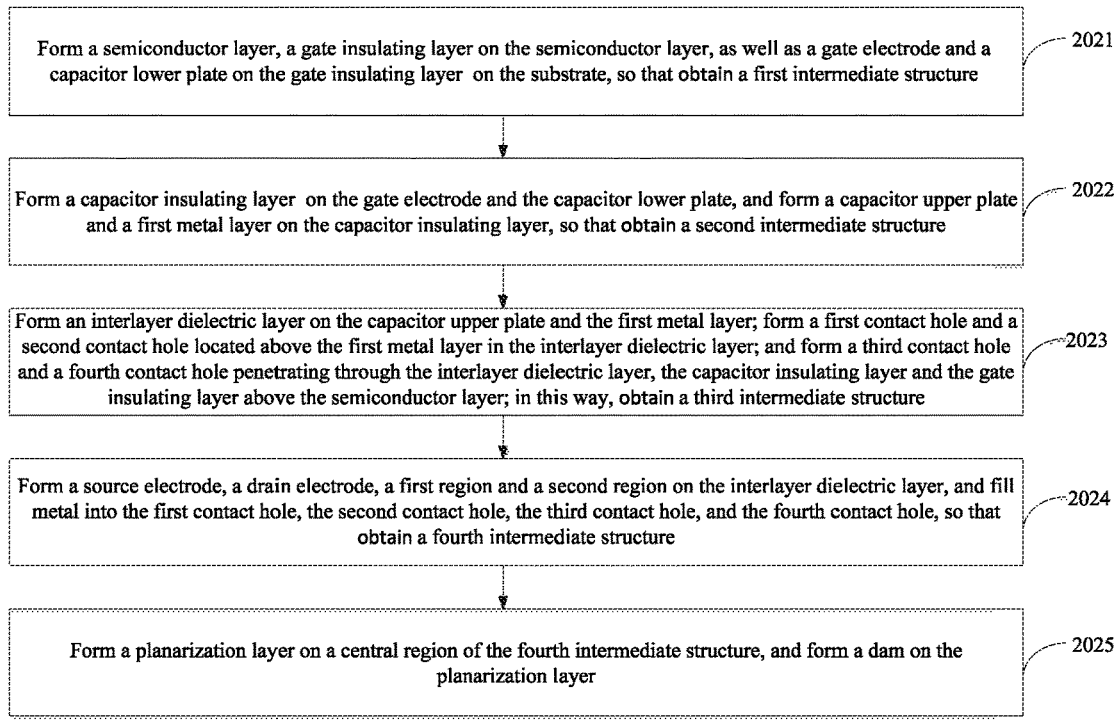
FIG. 7 is a flowchart of forming a TFT layer on a substrate according to an example of the present disclosure.

Optionally, the first metal layer 21 and the capacitor upper plate 27 are formed simultaneously, and the second metal layer 23, the source electrode 291, and the drain electrode 292 are formed simultaneously. The first inorganic layer 22 is a part of the interlayer dielectric layer 28. Correspondingly, as shown in FIG. 7, step 202 may include steps 2021 to 2025.

At step 2021, a semiconductor layer, a gate insulating layer on the semiconductor layer, as well as a gate electrode and a capacitor lower plate on the gate insulating layer are formed on the substrate, so that a first intermediate structure is obtained.

Figure 8:
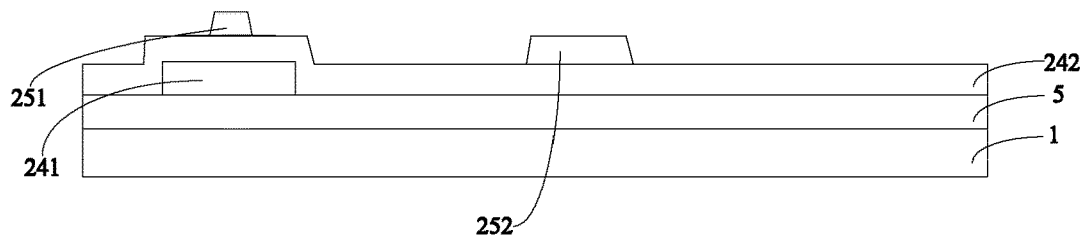
FIG. 8 is a structural diagram of a first intermediate structure according to the present disclosure.

FIG. 8 is a schematic diagram of the first intermediate structure.

The process that the gate electrode 251 and the capacitor lower plate 252 are formed on the gate insulating layer 242 may be as follows: a metal layer is formed on the whole of the gate insulating layer 242 firstly, then the metal layer is covered by a mask, and lastly a part of the metal layer that is exposed via the opening of the mask is etched, so that the gate electrode 251 and the capacitor lower plate 252 are formed.

Optionally, with reference to FIG. 4, a first metal layer 21' in the marginal region is formed simultaneously when the gate electrode 251 and the capacitor lower plate 252 are formed. The first metal layer 21' is coupled with the gate electrode 251, and configured as scan lines.

At step 2022, a capacitor insulating layer is formed on the gate electrode and the capacitor lower plate, and a capacitor upper plate and a first metal layer are formed on the capacitor insulating layer, so that a second intermediate structure is obtained.

Figure 9:
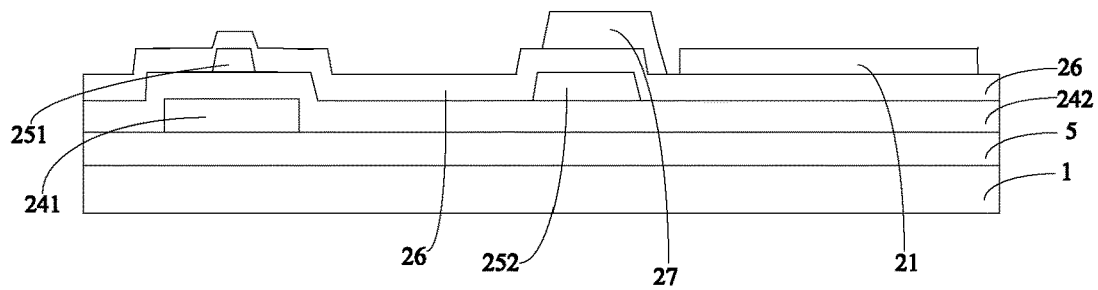
FIG. 9 is a structural diagram of a second intermediate structure according to an example of the present disclosure.

FIG. 9 is a schematic diagram of the second intermediate structure.

The process that the capacitor upper plate 27 and the first metal layer 21 are formed on the capacitor insulating layer 26 may be as follows: a metal layer is formed on the whole of the capacitor insulating layer 26 firstly, then the metal layer is covered by a mask, and lastly a part of the metal layer that is exposed through the opening of the mask is etched, so that the capacitor upper plate 27 and the first metal layer 21 are formed.

Optionally, the first metal layer 21 may have a width ranging from 200 μm to 2000 μm, such as 250 μm, 500 μm, 1000 μm, 1500 μm, 1800 μm, and the like.

At step 2023, an interlayer dielectric layer is formed on the capacitor upper plate and the first metal layer; a first contact hole and a second contact hole located above the first metal layer are formed in the interlayer dielectric layer; and a third contact hole and a fourth contact hole penetrating through the interlayer dielectric layer, the capacitor insulating layer and the gate insulating layer are formed above the semiconductor layer; in this way, a third intermediate structure is obtained.

FIG. 10 is a schematic diagram of the third intermediate structure.

The first contact hole 221 and the second contact hole 222 may be formed in the interlayer dielectric layer 28 by using a photo-etching technology or a dry etching technology, and the third contact hole 223 and the fourth contact hole 224 penetrating the interlayer dielectric layer 28, the capacitor insulating layer 26, and the gate insulating layer may be formed by using a photo-etching technology or a dry etching technology.

At step 2024, a source electrode, a drain electrode, a first region and a second region are formed on the interlayer dielectric layer, and metal is filled into the first contact hole, the second contact hole, the third contact hole, and the fourth contact hole, so that a fourth intermediate structure is obtained.

Figure 11:
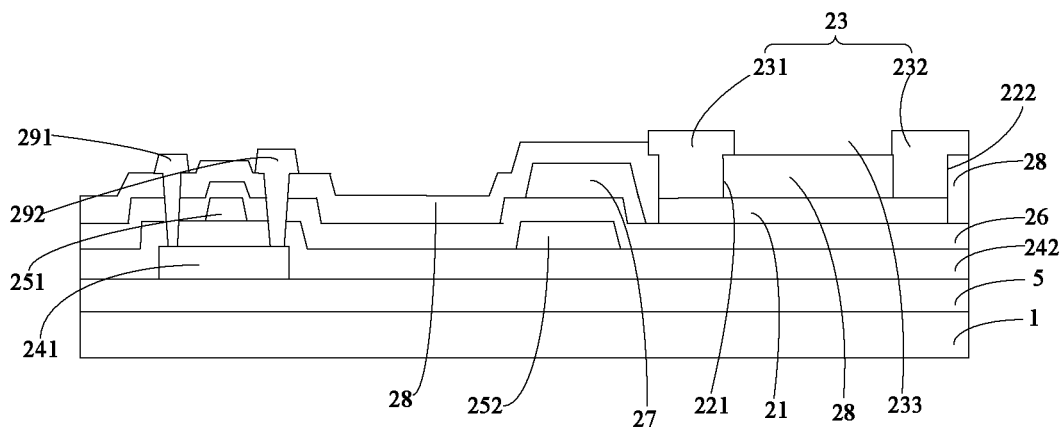
FIG. 11 is a structural diagram of a fourth intermediate structure according to an example of the present disclosure.

FIG. 11 is a schematic diagram of the fourth intermediate structure.

The process that the source electrode 291, the drain electrode 292, the first region 231 and the second region 232 are formed on the interlayer dielectric layer 28, and the metal is filled into the first contact hole 221, the second contact hole 222, the third contact hole 223, and the fourth contact hole 224 may be as follows: a metal layer is formed on the whole of the interlayer dielectric layer 28 firstly, then metal is filled into the first contact hole 221, the second contact hole 222, the third contact hole 223, and the fourth contact hole 224 simultaneously, the metal layer is covered by a mask, and lastly a part of the metal layer that is exposed through the opening of the mask is etched. In this way, portions of the metal layer that are remained are the source electrode 291, the drain electrode 292, the first region 231, and the second region 232, and a region between the first region 231 and the second region 232 is the hollowed-out region 233.

At step 2025, a planarization layer is formed on a central region of the fourth intermediate structure, and a dam is formed on the planarization layer.

The dam 294 has an annular structure. The planarization layer 293 is located on the first region 231. The second region 232 is located in the marginal region outside the dam. And the first metal layer 21 is at least partially located below the dam 294.

Figure 12:
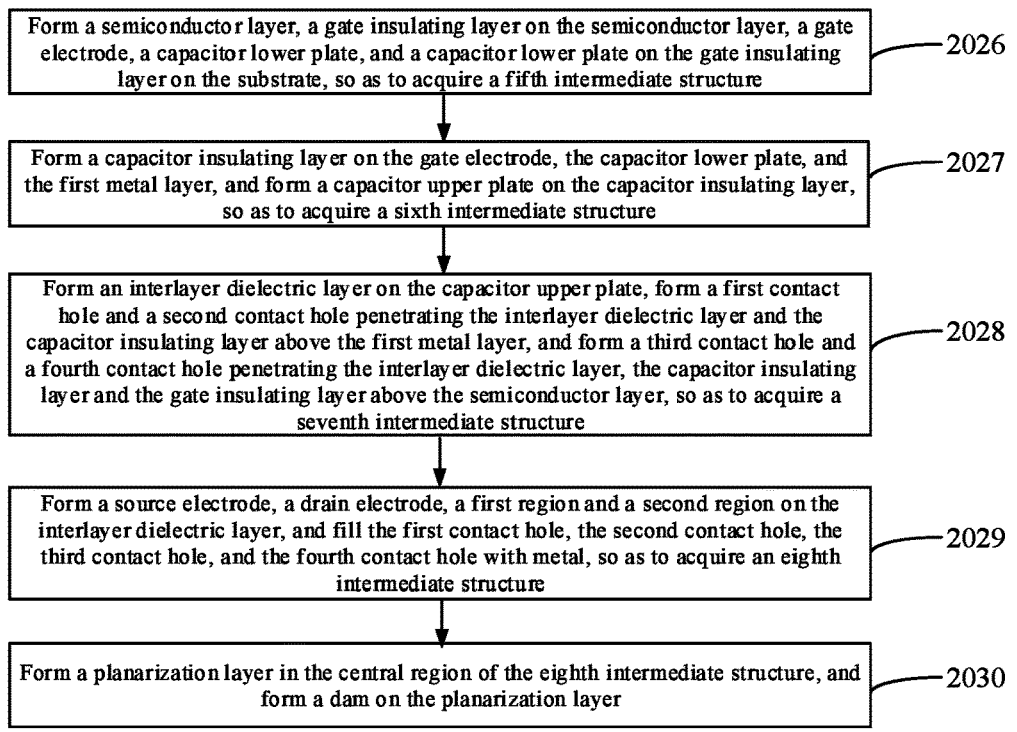
FIG. 12 is another flowchart of forming the TFT layer on the substrate according to an example of the present disclosure.

Optionally, the first metal layer 21 and the gate electrode 251 are formed simultaneously, the second metal layer 23, the source electrode 291 and the drain electrode 292 are formed simultaneously, and the first inorganic layer 22 is a part, which is in the marginal region, of both the capacitor insulating layer 26 and the interlayer dielectric layer 28. The first contact hole 221 and the second contact hole 222 penetrate the capacitor insulating layer 26 and the interlayer dielectric layer 28, respectively. Correspondingly, as shown in FIG. 12, step 202 may include steps 2026 to 2030.

At step 2026, a semiconductor layer, a gate insulating layer on the semiconductor layer, as well as a gate electrode, a capacitor lower plate and a first metal layer that are on the gate insulating layer are formed on the substrate, so that a fifth intermediate structure is obtained.

Figure 13:
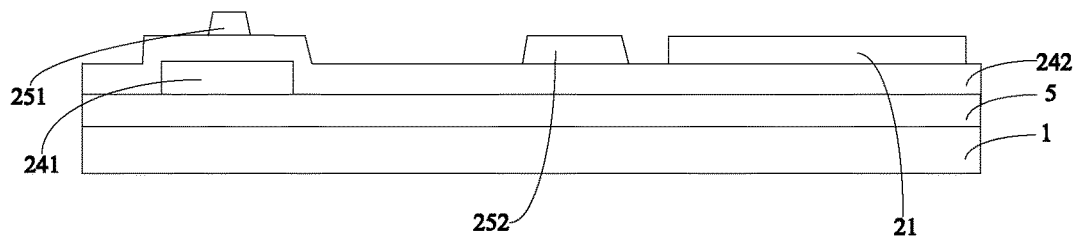
FIG. 13 is a structural diagram of a fifth intermediate structure according to an example of the present disclosure.

FIG. 13 is a schematic diagram of the fifth intermediate structure.

The process that the gate electrode 251, the capacitor lower plate 252, and the first metal layer 21 are formed on the gate insulating layer 242 may be as follows: a metal layer is formed on the whole of the gate insulating layer 242 firstly, then the metal layer is covered by a mask, and lastly a part of the metal layer that is exposed through the opening of the mask is etched. In this way, portions of the metal layer that are remained are the gate electrode 251, the capacitor lower plate 252, and the first metal layer 21.

With reference to FIG. 4 again, a first metal layer 21' is formed simultaneously when the first metal layer 21 is formed. The first metal layer 21' is coupled with the gate electrode 251, and configured as scan lines.

At step 2027, a capacitor insulating layer is formed on the gate electrode, the capacitor lower plate, and the first metal layer; and a capacitor upper plate is formed on the capacitor insulating layer. So, a sixth intermediate structure is obtained.

Figure 14:
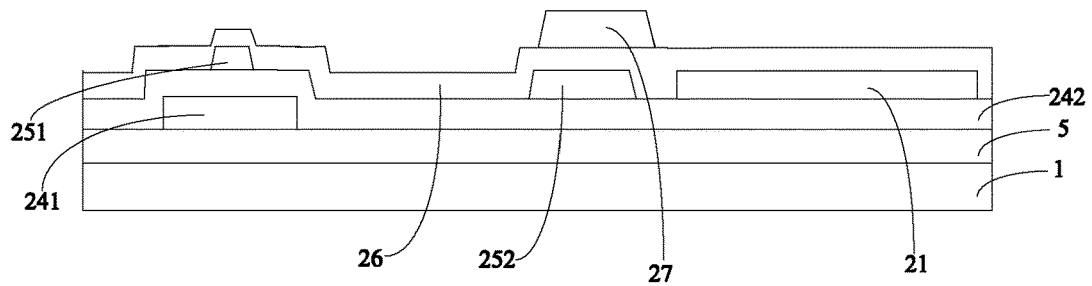
FIG. 14 is a structural diagram of a sixth intermediate structure according to an example of the present disclosure.

FIG. 14 is a schematic diagram of the sixth intermediate structure.

The process that the capacitor upper plate 27 is formed on the capacitor insulating layer 26 may be as follows: a metal layer is formed on the whole of the capacitor insulating layer 26 firstly, then the metal layer is covered by a mask, and lastly a part of the metal layer that is exposed through the opening of the mask is etched. In this way, a portion of the metal layer that is remained is the capacitor upper plate 27. A part of the metal layer that is in the marginal region is etched.

At step 2028, an interlayer dielectric layer is formed on the capacitor upper plate; a first contact hole and a second contact hole penetrating the interlayer dielectric layer and the capacitor insulating layer are formed above the first metal layer; and a third contact hole and a fourth contact hole penetrating the interlayer dielectric layer, the capacitor insulating layer and the gate insulating layer are formed above the semiconductor layer. So, a seventh intermediate structure is obtained.

Figure 15:
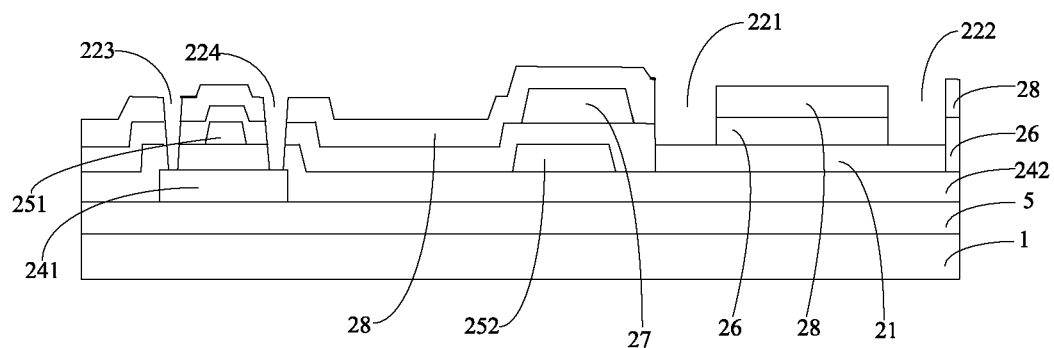
FIG. 15 is a structural diagram of a seventh intermediate structure according to an example of the present disclosure.

FIG. 15 is a schematic diagram of the seventh intermediate structure.

The first contact hole 221, the second contact hole 222, the third contact hole 223, and the fourth contact hole 224 may be formed by using a photo-etching technology or a dry etching technology.

At step 2029, a source electrode, a drain electrode, a first region and a second region are formed on the interlayer dielectric layer, and metal is filled into the first contact hole, the second contact hole, the third contact hole, and the fourth contact hole, so that an eighth intermediate structure is obtained.

Figure 16:
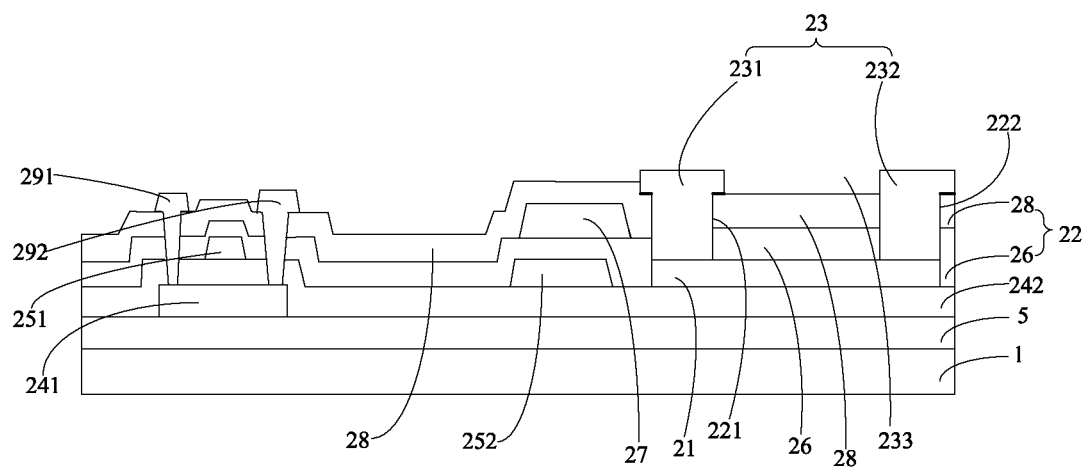
FIG. 16 is a structural diagram of an eighth intermediate structure according to an example of the present disclosure.

FIG. 16 is a schematic diagram of the eighth intermediate structure.

The process that the source electrode 291, the drain electrode 292, the first region 231 and the second region 232 are formed on the interlayer dielectric layer 28, and metal is filled into the first contact hole 221, the second contact hole 222, the third contact hole 223, and the fourth contact hole 224 may be as follows: a metal layer is formed on the whole of the interlayer dielectric layer 28 firstly, then metal is filled into the first contact hole 221, the second contact hole 222, the third contact hole 223, and the fourth contact hole 224 simultaneously, the metal layer is covered by a mask, and a portion of the metal layer which is exposed through the opening of the mask is etched lastly. In this way, portions of the metal layer that are remained are the source electrode 291, the drain electrode 292, the first region 231, and the second region 232. A region between the first region 231 and the second region 232 is the hollowed-out region 233.

At step 2030, a planarization layer is formed on a central region of the eighth intermediate structure, and a dam is formed on the planarization layer.

The dam 294 has an annular structure. The planarization layer 293 is located on the first region 231. The second region 232 is located in the marginal region outside the dam. And the first metal layer 21 is at least partially located below the dam 294.

At step 203, an OLED layer is formed on the TFT layer.

The OLED layer 4 is located in a region enclosed by the dam. The OLED layer 4 may include an anode formed on the planarization layer 293, an organic light emitting layer formed on the anode, and a cathode formed on the organic light emitting layer. The anode of the OLED layer 4 is in contact with a drain electrode of the TFT layer 2.

At step 204, an encapsulation layer is formed on the OLED layer and in the marginal region of the TFT layer. A portion of the encapsulation layer that is located in the hollowed-out region is in contact with the first inorganic layer.

The display panel shown in FIG. 2 or FIG. 3 can be obtained through step 204.

Optionally, the encapsulation layer 3 may be a TFE layer, and the TFE layer includes a second inorganic layer formed on the TFT layer 2. The second inorganic layer is the lowermost layer of the encapsulation layer 3, and the first inorganic layer 22 may be made of the same material as the second inorganic layer. A portion of the second inorganic layer that is located in the hollowed-out region 233 is in contact with the first inorganic layer 22. The adhesion between the second inorganic layer and the first inorganic layer 22 is increased due to their same material, thereby further improving the adhesion between the encapsulation layer 3 and the marginal region of the TFT layer 2, which lengthens the service life of the display panel 100. Specifically, the first inorganic layer 22 and the second inorganic layer may be made of silicon oxide or silicon nitride. The encapsulation layer 3 may also include a laminated layer with organic layer(s) and inorganic layer(s) which is formed on the second inorganic layer. For example, the encapsulation layer 3 is a three-layer structure with a silicon nitride layer, an organic layer, and a silicon nitride layer.

In the manufacturing method of the display panel provided by the examples of the present disclosure, the first region 231 of the second metal layer 23 of the TFT layer 2 is electrically connected with the second region 232 through the first metal layer 21, so as to ensure the normal operation of the display panel 100. The encapsulation layer 3 formed above the TFT layer 2 has a portion located in the hollowed-out region 233, and the portion is in contact with the first inorganic layer 22, so that the adhesion between the TFT layer 2 and the encapsulation layer 3 is increased, thereby effectively preventing the TFT layer 2 and the encapsulation layer 3 from being peeled off from each other, which lengthens the service life of the display panel 100.

The examples of the present disclosure further provide a display device, which includes the flexible display panel described above. Optionally, the display device further includes a housing, on which the flexible display panel is secured.

The display device in the examples of the present disclosure may be any product or component having a display function, such as an electronic paper, a mobile phone, a tablet computer, a television, a notebook computer, a digital photo frame, a navigator, and the like.

The foregoing disclosure is merely illustrative of embodiments of the present disclosure, and shall not be intended to limit the present disclosure in any form. Although the embodiments of the present disclosure are described above in a manner of preferable examples, these descriptions are not intended to limit the present disclosure. Any person skilled in the art may make some variations or modifications as equivalent embodiments with equivalent changes based on the technical contents described above without departing from the scope of the technical solution of the present disclosure. All simple variations, equivalent changes, and modifications made to the above embodiments in accordance with the technical substance of the present disclosure without departing from the contents of the technical solution of the present disclosure, shall all fall into the scope of the technical solution of the present disclosure.

The invention claimed is:

1. A display panel, comprising:
 a substrate;
 a Thin Film Transistor layer located on the substrate, wherein the Thin Film Transistor layer comprises a thin film transistor with a source electrode, a drain electrode and a gate electrode; a first metal layer; a first inorganic layer on the first metal layer; and a second metal layer on the first inorganic layer, wherein the second metal layer comprises a first region and a second region, a hollowed-out region is formed between the first region and the second region, and the first region and the second region are electrically connected via the first metal layer; and an encapsulation layer located on the Thin Film Transistor layer, wherein a portion of the encapsulation layer located in the hollowed-out region is in direct contact with the first inorganic layer.

2. The display panel according to claim 1, wherein the first inorganic layer comprises a first contact hole and a second contact hole which are spaced apart, the first contact hole and the second contact hole are filled with metal, the first region and the first metal layer are electrically connected via the metal in the first contact hole, and the second region and the first metal layer are electrically connected via the metal in the second contact hole.

3. The display panel according to claim 2, wherein the first contact hole has a width smaller than that of the first metal layer, and the second contact hole has a width smaller than that of the first metal layer.

4. The display panel according to claim 1, wherein the Thin Film Transistor layer further comprises an annular dam located on the second metal layer, the second region is located outside the annular dam, and the first metal layer is at least partially located below the annular dam.

5. The display panel according to claim 4, further comprising an OLED layer formed between the TFT layer and the encapsulation layer, and the OLED layer is located in a region enclosed by the annular dam.

6. The display panel according to claim 1, wherein the first metal layer has a width ranging from 200 μm to 2000 μm.

7. The display panel according to claim 1, wherein the Thin Film Transistor layer further comprises a capacitor upper plate, the first metal layer is on the same layer as the capacitor upper plate, and the second metal layer is on the same layer as the source electrode.

8. The display panel according to claim 1, wherein the first metal layer is on the same layer as the gate electrode, and the second metal layer is on the same layer as the source electrode.

9. The display panel according to claim 1, wherein a marginal region of the Thin Film Transistor layer is provided with a plurality of first contact holes and a plurality of second contact holes, and the plurality of first contact holes are in one-to-one correspondence with the plurality of second contact holes.

10. The display panel according to claim 1, further comprising a buffer layer formed between the substrate and the Thin Film Transistor layer, and a material of the buffer layer is at least one of silicon oxide or silicon nitride.

11. The display panel according to claim 1, wherein the display panel is a flexible display panel.

12. A display device, comprising:
   a display panel that comprises:
      a substrate;
      a Thin Film Transistor layer located on the substrate, wherein the Thin Film Transistor layer comprises a thin film transistor with a source electrode, a drain electrode and a gate electrode; a first metal layer; a first inorganic layer on the first metal layer; and a second metal layer on the first inorganic layer, wherein the second metal layer comprises a first region and a second region, a hollowed-out region is formed between the first region and the second region, and the first region and the second region are electrically connected via the first metal layer; and
      an encapsulation layer located on the Thin Film Transistor layer, wherein a portion of the encapsulation layer that is located in the hollowed-out region is in direct contact with the first inorganic layer.

13. The display device according to claim 12, wherein the first inorganic layer comprises a first contact hole and a second contact hole which are spaced apart, the first contact hole and the second contact hole are filled with metal, the first region and the first metal layer are electrically connected via the metal in the first contact hole, and the second region and the first metal layer are electrically connected via the metal in the second contact hole.

14. The display device according to claim 13, wherein the first contact hole has a width smaller than that of the first metal layer, and the second contact hole has a width smaller than that of the first metal layer.

15. The display device according to claim 12, wherein the Thin Film Transistor layer further comprises an annular dam located on the second metal layer, the second region is located outside the annular dam, and the first metal layer is at least partially located below the annular dam.

16. The display device according to claim 15, wherein the display panel further comprises an OLED layer formed between the Thin Film Transistor layer and the encapsulation layer, and the OLED layer is located in a region enclosed by the annular dam.

* * * * *